United States Patent
Asai et al.

(10) Patent No.: US 12,020,893 B2
(45) Date of Patent: Jun. 25, 2024

(54) ION MILLING DEVICE

(71) Applicant: Hitachi High-Tech Corporation, Tokyo (JP)

(72) Inventors: Kengo Asai, Tokyo (JP); Hisayuki Takasu, Tokyo (JP); Toru Iwaya, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 30 days.

(21) Appl. No.: 17/791,295

(22) PCT Filed: Jan. 29, 2020

(86) PCT No.: PCT/JP2020/003186
§ 371 (c)(1),
(2) Date: Jul. 7, 2022

(87) PCT Pub. No.: WO2021/152726
PCT Pub. Date: Aug. 5, 2021

(65) Prior Publication Data
US 2023/0352263 A1  Nov. 2, 2023

(51) Int. Cl.
*H01J 37/08* (2006.01)
*H01J 37/302* (2006.01)
*H01J 37/305* (2006.01)

(52) U.S. Cl.
CPC ............ *H01J 37/08* (2013.01); *H01J 37/302* (2013.01); *H01J 37/305* (2013.01); *H01J 2237/0815* (2013.01); *H01J 2237/0822* (2013.01)

(58) Field of Classification Search
CPC ........ H01J 37/08; H01J 37/302; H01J 37/305; H01J 37/3056; H01J 37/3053; H01J 2237/0815; H01J 2237/0822
See application file for complete search history.

(56) References Cited

U.S. PATENT DOCUMENTS

2010/0025577 A1* 2/2010 Grunewald .............. G01N 1/32
                                                                 250/307
2011/0163068 A1* 7/2011 Utlaut ....................... G03F 1/84
                                                                 216/66
(Continued)

FOREIGN PATENT DOCUMENTS

JP    H09106778 A    4/1997
JP    2009170117 A   7/2009
(Continued)

OTHER PUBLICATIONS

Search Report dated Mar. 31, 2020 in International Application No. PCT/JP2020/003186.
(Continued)

*Primary Examiner* — David E Smith
(74) *Attorney, Agent, or Firm* — Miles & Stockbridge, P.C.

(57) ABSTRACT

An ion milling device which balances high processing speed and a wide processing region with smoothness of a processing surface. The ion milling device includes first to third ion guns that emit unfocused ion beams. An ion beam center of the third ion gun is included in a first plane defined by a normal to a surface of a sample and a mask end, and an ion beam center of the first ion gun and an ion beam center of the second ion gun are included in a second plane. The second plane is inclined toward the mask with respect to the first plane, and an angle formed by the first plane and the second plane is more than 0 degrees and 10 degrees or less. The processing surface of the sample is formed in a region where the emitted ion beams overlap on the surface of the sample.

14 Claims, 7 Drawing Sheets

(56) References Cited

U.S. PATENT DOCUMENTS

2013/0316536 A1* 11/2013 Seto .................. H01L 21/2633
438/689
2019/0272973 A1 9/2019 Kaneko et al.

FOREIGN PATENT DOCUMENTS

| | | |
|---|---|---|
| JP | 2010520465 A | 6/2010 |
| JP | 2013243307 A | 12/2013 |
| WO | 2018029778 A1 | 2/2018 |

OTHER PUBLICATIONS

Written Opinion dated Mar. 31, 2020 in International Application No. PCT/JP2020/003186.

* cited by examiner

ION MILLING DEVICE

TECHNICAL FIELD

The present invention relates to an ion milling device suitable for preparing a sample to be observed with an electron microscope.

BACKGROUND ART

An ion milling method is a processing method in which accelerated ions are made to collide with a sample and the sample is scraped by utilizing a sputtering phenomenon in which ions repel atoms and molecules. A smooth cross section can be obtained by placing a mask that serves as a shielding plate for ion beams on an upper surface of the sample and sputtering a protruding portion from a mask end surface. Therefore, an ion milling device is used for processing on metals, glass, ceramics, electronic components, composite materials and the like, and is widely used for preparing a cross-sectional sample that is used to acquire a morphological image, a sample composition image, or a channeling image by a scanning electron microscope, and to perform X-ray analysis, crystal orientation analysis, or the like for the purpose of, for example, analyzing an internal structure, a cross-sectional shape, a film thickness evaluation, a crystal state, a failure, or a foreign matter cross section of an electronic component.

PTL 1 discloses a method for preparing a sample for an electron microscope in which a high processing speed and good sample quality are achieved by processing with a plurality of ion beams. PTL 2 discloses an ion milling device that improves deterioration in processing position accuracy due to the use of an ion source having a high processing speed in the ion milling device by being provided with a tilt mechanism that relatively tilts a sample and a mask with respect to an ion beam.

CITATION LIST

Patent Literature

PTL 1: JP-T-2010-520465
PTL 2: WO 2018/029778

SUMMARY OF INVENTION

Technical Problem

In PTL 1, by orienting a plurality of ion beams to each other at a predetermined angle on a plane or on a conical sleeve surface and irradiating a surface of the sample with the ion beams, and superimposing the ion beams in a projection zone on the surface of the sample, good sample quality can be achieved by processing in a position-invariant state in which neither the sample nor the ion beams are moved.

In accordance with recent development of ion milling devices, a market thereof has been widely expanded, and a further improved processing speed has always been achieved depending on the field of application. However, there is a problem that since a high processing speed is achieved by an ion beam with extremely high ion energy or ion stream density, sample quality is easily impaired due to a milling mark and curtaining on a processing surface in exchange for the high processing speed.

The inventors performed cross-section processing by using an ion milling device in which ion guns capable of high-speed processing a Si substrate at 1 mm/h or more (an ion beam current value at this time is about 300 µA) are used and two of the ion guns are arranged in a plane perpendicular to the surface of the sample and ion beams from the ion guns overlap on the surface of the sample, and evaluated smoothness of a processing surface obtained by the cross-section processing. According to this evaluation, a sufficiently smooth processing surface was not obtained due to beam marks on the processing surface. Further, there is also a problem as disclosed in PTL 2 that a sample processing surface is formed in an overhang shape from a mask end surface and a sample processing surface along the mask end surface cannot be obtained. It is considered that in PTL 1, an ion milling device using an ion gun that emits an ion beam having relatively small ion energy is assumed, and it is considered that as a difference between results of the two devices, a problem that no problem is found by using an ion gun irradiating an ion beam with low ion energy or ion stream density is surfaced.

The invention has been made in view of these points, and an object of the invention relates to an ion milling device suitable for preparing a sample to be observed with an electron microscope, and is to improve the smoothness of the processing surface even in an ion milling device that uses a Penning discharge type ion gun having a high processing speed by achieving higher plasma efficiency than that in the related art.

Solution to Problem

An ion milling device according to an embodiment of the invention includes a vacuum chamber in which an internal air pressure is controlled by a vacuum exhaust system, a first ion gun to a third ion gun attached to the vacuum chamber and configured to emit unfocused ion beams, and a sample platform disposed in the vacuum chamber and configured to hold a sample. A mask for shielding an ion beam is disposed on the sample, the first ion gun to the third ion gun are attached to the vacuum chamber such that an ion beam center of the ion beam emitted by the third ion gun is included in a first plane defined by a normal to a surface of the sample and a mask end which is a boundary between the mask and the sample, and an ion beam center of the ion beam emitted by the first ion gun and an ion beam center of the ion beam emitted by the second ion gun are included in a second plane. The second plane is inclined toward the mask with respect to the first plane, and an angle formed by the first plane and the second plane is more than 0 degree and 10 degrees or less. A processing surface of the sample is formed in a region where the ion beams emitted by the first ion gun to the third ion gun overlap on the surface of the sample.

Advantageous Effects of Invention

An ion milling device with which it is possible to balance high processing speed and a wide processing region with smoothness of a processing surface can be provided.

Other problems and novel characteristics will become apparent from a description of the description and the drawings.

DESCRIPTION OF EMBODIMENTS

Hereinafter, preferred embodiments of the invention will be described with reference to the drawings.

First Embodiment

Figure 1A:
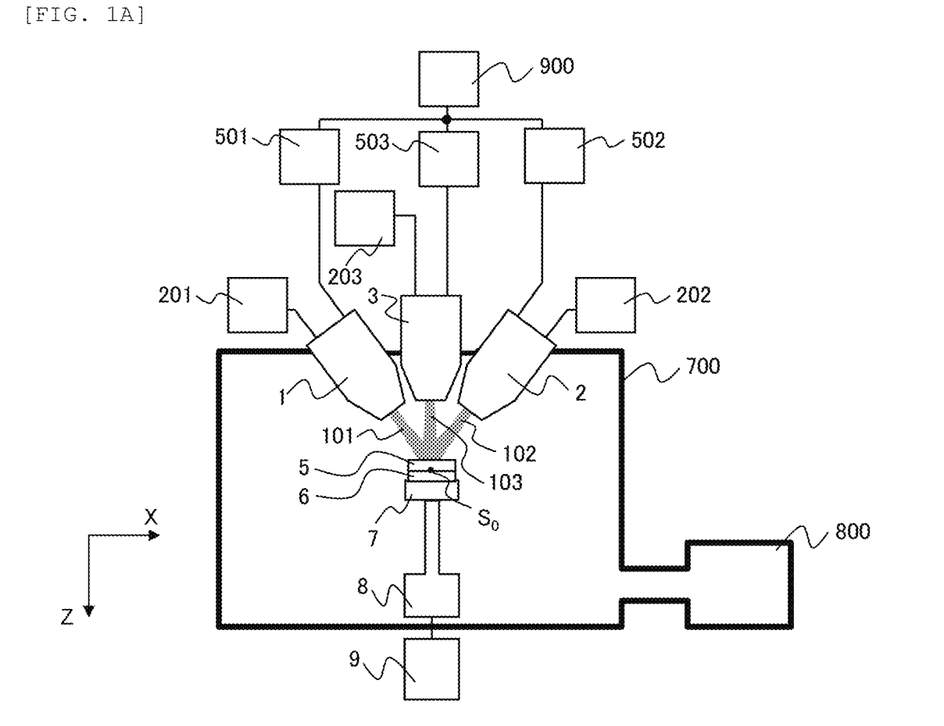
FIG. 1A is a cross-sectional schematic diagram of main parts showing a configuration of an ion milling device according to a first embodiment.

FIG. 1A is a cross-sectional schematic diagram of main parts showing a configuration of an ion milling device according to the first embodiment. An ion gun 1, an ion gun 2 and an ion gun 3 are Penning discharge type ion guns. Each of the Penning discharge type ion guns 1 to 3 includes elements necessary for generating ions inside the ion gun, and forms an irradiation system that irradiates a sample 6 with an unfocused ion beam. Each of gas supply mechanisms 501 to 503 includes all components necessary for adjusting a flow rate of a gas to be ionized and supplying the gas into the ion gun. As an example, an Ar gas is used as an introduced gas.

The ion gun 1 is disposed such that the sample 6 is irradiated with an ion beam 101 at an incident angle of 45 degrees ($\varphi_1$) with respect to a sample surface. A gas source 900 is connected to the ion gun 1 via the gas supply mechanism 501, and the Ar gas controlled independently of other ion guns by the gas supply mechanism 501 is supplied into a plasma generation chamber of the ion gun 1. The emission of the ion beam 101 and an ion beam current thereof are controlled independently of other ion guns by an ion gun control unit 201. An example of the structure of the ion gun will be described later. Further, the value of the incident angle $\varphi_1$ described above is an example, and the ion gun 1 may be disposed such that the incident angle $\varphi_1$ is, for example, 10 degrees or more and 80 degrees or less.

The ion gun 2 is disposed such that the sample 6 is irradiated with an ion beam 102 at an incident angle of 45 degrees ($\varphi_2$) with respect to the sample surface. The gas source 900 is connected to the ion gun 2 via the gas supply mechanism 502, and the Ar gas controlled independently of other ion guns by the gas supply mechanism 502 is supplied into a plasma generation chamber of the ion gun 2. The emission of the ion beam 102 and an ion beam current thereof are controlled independently of other ion guns by an ion gun control unit 202. Further, the value of the incident angle $\varphi_2$ described above is an example, and the ion gun 2 may be disposed such that the incident angle $\varphi_2$ is, for example, 10 degrees or more and 80 degrees or less.

The ion gun 3 is disposed such that the sample 6 is irradiated with an ion beam 103 at an incident angle of 0 degree with respect to the sample surface. The gas source 900 is connected to the ion gun 3 via the gas supply mechanism 503, and the Ar gas controlled independently of other ion guns by the gas supply mechanism 503 is supplied into a plasma generation chamber of the ion gun 3. The emission of the ion beam 103 and an ion beam current thereof are controlled independently of other ion guns by an ion gun control unit 203.

The ion guns 1 to 3 are attached to a vacuum chamber 700, and an internal air pressure of the vacuum chamber 700 is controlled to atmospheric pressure or vacuum by a vacuum exhaust system 800. The sample 6 is held on a sample platform 7, and the sample platform 7 is held by a sample stage 8. When cross-section processing of the sample 6 is performed, a mask 5 for shielding an ion beam is disposed on the sample 6, and the sample 6 is disposed so as to protrude from a mask end by a protrusion amount set in advance from the mask 5 (see FIG. 1C). The sample stage 8 can be pulled out of the vacuum chamber 700 when the vacuum chamber 700 is exposed to the atmosphere. A sample stage driver 9 is provided to drive the sample stage 8. For example, the sample stage driver 9 is disposed on a surface of the sample 6, and is capable of swinging the sample stage 8 left and right around a swing axis $S_0$ parallel to a Y axis, and controlling a speed of the sample stage 8.

Figure 1B:
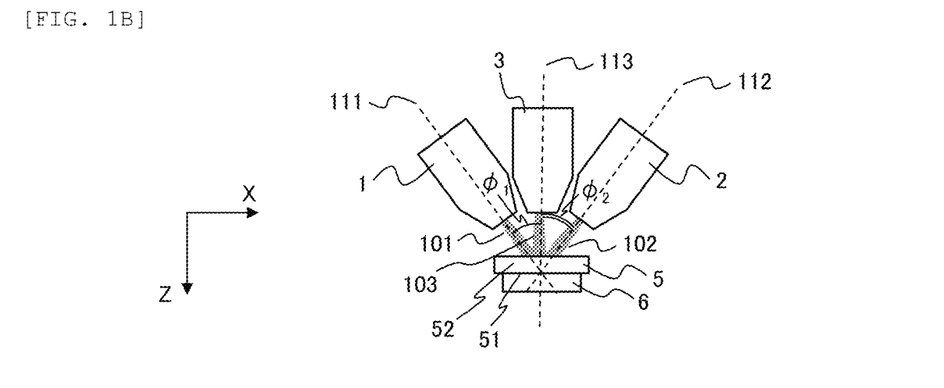
FIG. 1B is a cross-sectional schematic diagram illustrating an ion gun arrangement as seen from an X-Z plane.
Figure 1C:
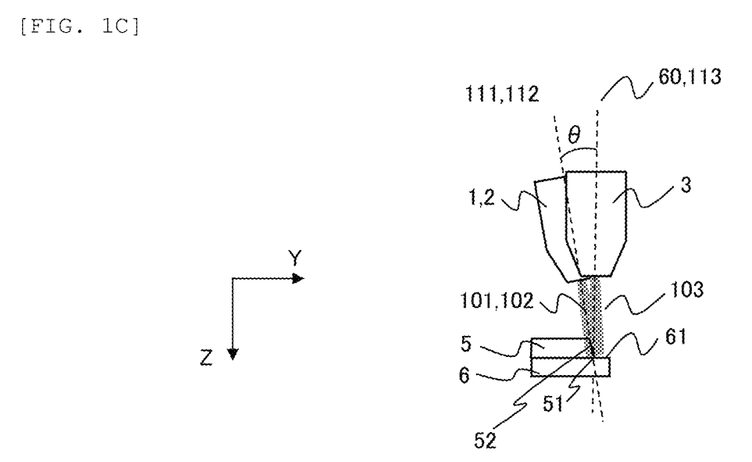
FIG. 1C is a cross-sectional schematic diagram illustrating the ion gun arrangement as seen from a Y-Z plane.

FIG. 1B is a cross-sectional schematic diagram illustrating an ion gun arrangement with respect to the sample as seen from an X-Z plane, and FIG. 1C is a cross-sectional schematic diagram illustrating the ion gun arrangement with respect to the sample as seen from a Y-Z plane. In this embodiment, a Z-axis direction is defined to coincide with a normal direction of the sample surface, and an X-axis direction is defined to coincide with a longitudinal direction of the mask end. As shown in FIG. 1B, when seen from the X-Z plane, an irradiation region by the ion beam emitted from the ion gun 1, an irradiation region by the ion beam emitted from the ion gun 2, and an irradiation region by the ion beam emitted from the ion gun 3 are adjusted to overlap on the surface of the sample 6. Further, as shown in FIG. 1C, when seen from the Y-Z plane, an ion beam center 113 of the ion beam 103 emitted from the ion gun 3 is disposed on a first plane defined by the normal 60 to a sample surface 61 and the mask end 51, and an ion beam center 111 of the ion beam 101 emitted from the ion gun 1 and an ion beam center 112 of the ion beam 102 emitted from the ion gun 2 are disposed on a second plane different from the first plane. The second plane is inclined toward the mask with respect to the first plane at an angle of $\theta=5$ degrees. The value of the inclination angle $\theta$ described above (angle formed by the first plane and the second plane) is an example, and it is desirable to set the inclination angle $\theta$ in a range of more than 0 degree and 10 degrees or less.

At this time, it is desirable that an end surface 52 of the mask 5 is also inclined toward the mask with respect to the first plane. This is to facilitate alignment between the mask end 51 and an ion beam center of an ion beam from an ion gun disposed at the inclination angle θ when the position of the sample 6 is adjusted. A value of an inclination angle of the end surface 52 of the mask 5 is not particularly limited, and in the example of FIG. 1C, the inclination angle is the same as the inclination angle θ of the second plane. It is not preferable to set the inclination angle of the mask end surface 52 too large because the mask 5 is milled by the ion beams and the position of the mask end 51 is likely to be displaced. The mask end 51 refers to a boundary between the mask 5 and the sample 6, and the mask end surface 52 refers to a side surface of the mask 5 including the mask end 51.

In the ion milling device shown in FIG. 1A, the ion beams 101 and 102 emitted from the ion gun 1 and the ion gun 2, that is, the two ion beams disposed on the second plane perform the main cross-section processing. Further, the number of ion beams disposed on the second plane is not limited to 2, and a larger number of ion beams may be disposed. On the other hand, the ion beam 103 emitted from the ion gun 3, that is, the ion beam disposed on the first plane performs fine processing that removes beam marks and distortions on a processing surface and smooths and flattens the processing surface.

Figure 2A:
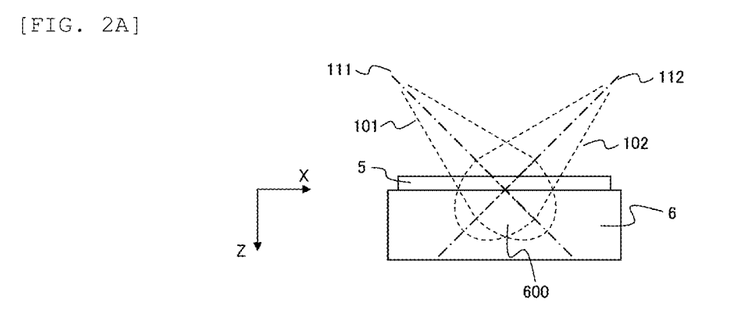
FIG. 2A is a schematic diagram showing a processing profile with a high acceleration ion beam.
Figure 2B:
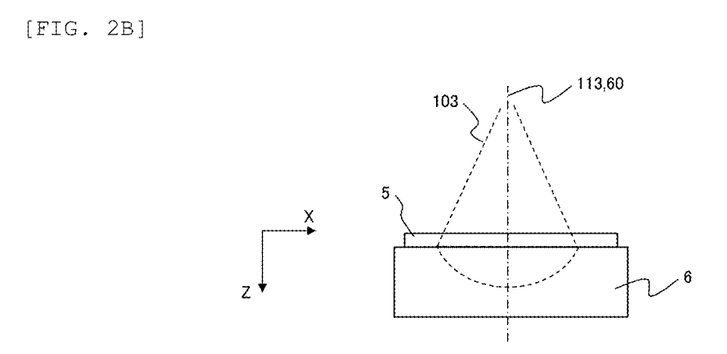
FIG. 2B is a schematic diagram showing a processing profile with a low acceleration ion beam.

FIG. 2A and FIG. 2B are cross-sectional schematic diagrams showing a beam profile based on an ion energy intensity. FIG. 2A shows processing profiles by the high acceleration ion beams 101 and 102. Regarding profiles of a processing surface formed on the sample 6 by the high acceleration ion beams 101 and 102 which perform the main cross-section processing, a processing depth (Z-axis direction) is large, and a processing width (X-axis direction) is small. By superimposing the two ion beams 100 and 102, an obtained processing surface 600 can be smoothed and the processing width can be increased. On the other hand, FIG. 2B shows a processing profile by the low acceleration ion beam 103. Regarding a profile of a processing surface formed on the sample 6 by the low acceleration ion beam 103 which removes beam marks and distortions due to the high acceleration ion beams and smooths and flattens the processing surface, the processing depth (Z direction) is small, and the processing width (X-axis direction) is large. Since scattering of the low acceleration ion beam 103 inside the sample 6 is small, even if the inclination angle (θ=0 degree) coincides with the normal 60 to the surface of the sample 6, the processing surface does not have an overhang shape, and the inclination angle does not interfere with the formation of a cross section at a desired location. Therefore, the wide processing surface on which the two high acceleration ion beams are superimposed can be covered with the one low acceleration ion beam, and the processing surface 600 formed by being irradiated with the three ion beams can ensure high smoothness. The high acceleration and the low acceleration here are distinguished by relative values of the acceleration voltages of the ion beams from the ion guns 1 to 3, and a specific value of the acceleration voltage is adjusted so that a desired processing surface can be obtained. In addition, as will be described later, when the acceleration voltage is dynamically controlled, the high acceleration and the low acceleration are distinguished by relative average values of the acceleration voltages.

Figure 3:
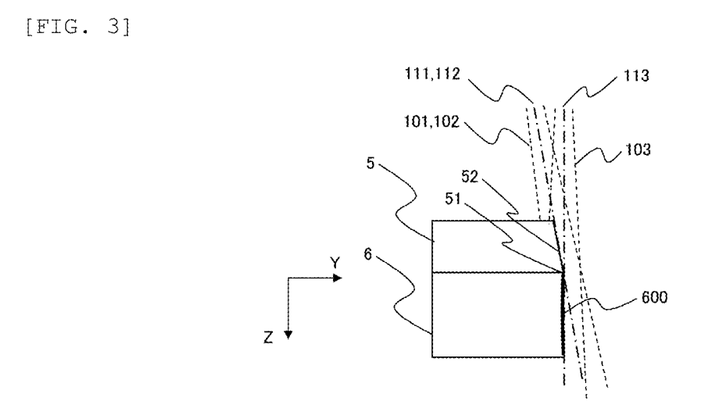
FIG. 3 is a cross-sectional schematic diagram illustrating an effect of the first embodiment.

FIG. 3 is a cross-sectional schematic diagram illustrating an effect of the present embodiment. In the cross-section processing performed by the ion milling device having a device configuration of FIG. 1A, as shown in FIG. 3, by inclining the ion beam centers 111 and 112 of the two high acceleration ion beams 101 and 102 incident on the sample 6 at a predetermined inclination angle in a direction toward the mask when seen from the normal 60 to the sample surface 61 of the sample 6, the processing surface 600 having no overhang can be formed with respect to the mask 5 in a short time. Further, the beam marks and the distortions on the surface can be removed by the low acceleration ion beam 103 incident at an angle consistent with the normal 60 to the surface of the sample 6, and the processing surface 600 more perpendicular to the mask 5 can be formed by smoothing and flattening the processing surface.

Figure 4A:
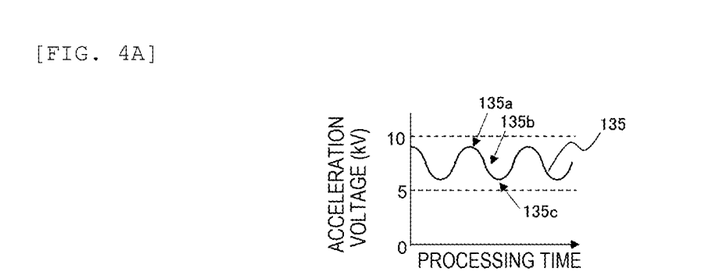
FIG. 4A is an illustrative diagram showing a state of dynamic control of an acceleration voltage.
Figure 4B:
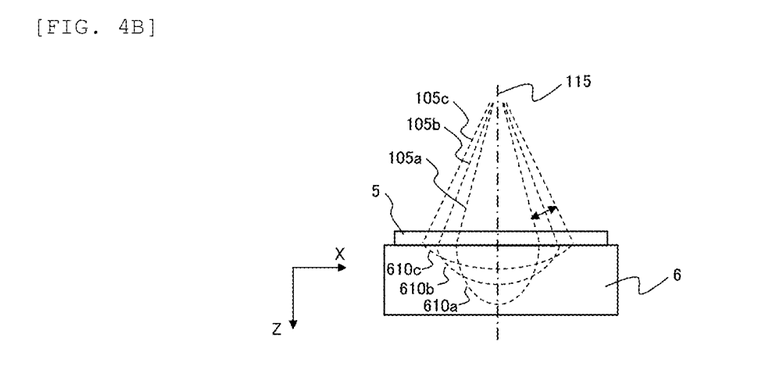
FIG. 4B is an illustrative diagram showing a change in the processing profile due to the dynamic control of the acceleration voltage.

The processing surface 600 can be further smoothed and flattened by controlling the ion beam stream emitted from the ion guns to the sample so as not to be kept stationary. For example, the magnitude of the ion energy of the ion beams emitted from the ion guns is dynamically changed on a time axis. FIG. 4A is an illustrative diagram showing a state of the dynamic control of the acceleration voltage applied to the ion guns, and FIG. 4B is an illustrative diagram showing that the ion beam stream changes due to the dynamic control of the acceleration voltage, and as a result, the processing profile changes. An ion gun control unit can be achieved by automatically controlling an acceleration voltage 135 so as to be continuously changed as shown in FIG. 4A during a processing operation by a predetermined program. As a result, the processing profile is continuously variable as shown in FIG. 4B. That is, a spread of an ion beam 105 changes around an ion beam center 115, specifically, the spread of the ion beam continuously changes between an ion beam 105a when the acceleration voltage is a local maximum value 135a and an ion beam 105c when the acceleration voltage is a local minimum value 135c, as a result, the processing profile also continuously changes between a processing profile 610a and a processing profile 610c. Since a deep beam mark is generated on the processing surface due to the same location of the sample 6 being irradiated with the same ion beam stream, the generation of the deep beam mark can be prevented by continuously changing the ion beam stream under the dynamic control of the acceleration voltage. FIG. 4B shows an example in which the ion beam is vertically incident on the sample surface, and the dynamic control of the acceleration voltage can be effective by being applied to at least one of the ion guns 1 to 3.

Further, another configuration for controlling the ion beam stream so as not to be kept stationary will be described. In the ion milling device as shown in FIG. 1A, a beam forming electrode for forming an ion beam is disposed in at least one of the ion guns. By the beam forming electrode forming the ion beam into an elliptical shape having a long axis along a longitudinal direction of the mask end 51, and expanding and contracting the length of the long axis (major axis) on the time axis, it is possible to control the ion beam stream emitted to the sample so as not to be kept stationary, and the processing surface 600 can be further smoothed and flattened. Such control can be achieved by dynamically controlling a voltage to be applied to the beam forming electrode on the time axis.

Figure 5A:
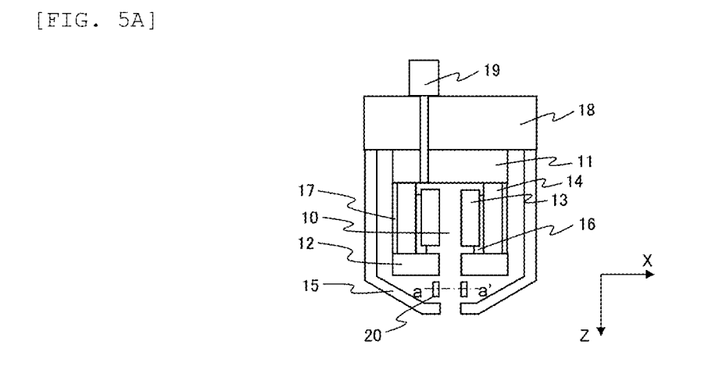
FIG. 5A is a structural cross-sectional diagram of a Penning discharge type ion gun including a beam forming electrode therein.

FIG. 5A is a structural cross-sectional diagram of a Penning discharge type ion gun including a beam forming electrode therein. A first cathode 11 is formed of a conductive magnetic material such as pure iron and is formed in a disk shape. The first cathode 11 is provided with a hole for introducing a gas into a plasma generation chamber 10, and a hole through which an anode pin (not shown) for supplying power to an anode 13 passes. Similarly, a second cathode 12 is formed of a conductive magnetic material such as pure iron and is formed in the disk shape, and is provided with an ion beam extraction hole in a central portion thereof. A permanent magnet 14 is, for example, a samarium cobalt magnet, and is formed in a cylindrical shape. One end of the permanent magnet 14 is connected to the first cathode 11, and the other end thereof is connected to the second cathode 12. A magnetic field is generated in the ion gun by the first cathode 11, the second cathode 12, and the permanent magnet 14. A cathode ring 17 is provided such that the permanent magnet 14 is not exposed to the environment. The cathode ring 17 is formed of a material such as stainless steel.

A cylindrical insulator 16 is disposed inside the permanent magnet 14, and an outer surface of the insulator 16 is in contact with an inner wall of the permanent magnet 14. The insulator 16 is formed of an electrically insulative non-magnetic material such as ceramics. The anode 13 is fitted inside the insulator 16, an outer surface of the anode 13 is in contact with an inner surface of the insulator 16, and an inner surface of the anode 13 faces the plasma generation chamber 10. The anode 13 is formed of, for example, a conductive non-magnetic material such as aluminum. The anode 13 is electrically insulated from the first cathode 11, the second cathode 12, and the permanent magnet 14 by the insulator 16.

An acceleration electrode 15 is formed in a cylindrical shape using a conductive non-magnetic material such as stainless steel, and is provided with an ion beam extraction hole in a central portion thereof. The acceleration electrode 15 maintained at a ground potential is fixed to a peripheral portion of an ion gun base 18 so as to surround the first cathode 11, the second cathode 12, and the permanent magnet 14. A hole is provided in the ion gun base 18 and the first cathode 11, and the Ar gas introduced from a gas introduction pipe 19 provided through these holes is introduced into the plasma generation chamber 10.

The Ar gas introduced from the plasma generation chamber 10 is maintained at an appropriate gas partial pressure, and a discharge voltage of about 2 kV is applied between the first cathode 11 and the second cathode 12 (the first cathode 11 and the second cathode 12 are electrically connected via the permanent magnet 14 and are maintained at the same potential) and the anode 13 by a discharge power supply to cause a Penning discharge. Electrons emitted from a surface of the first cathode 11 and a surface of the second cathode 12 are accelerated toward the anode 13 due to the application of the discharge voltage, and trajectories of the emitted electrons are bent for a swirling motion in the magnetic field formed in the plasma generation chamber 10 by the first cathode 11, the second cathode 12, and the permanent magnet 14. As the trajectories of the electrons are long due to the swirling motion, the discharge efficiency can be improved.

When the electrons swirling in the plasma generation chamber 10 collide with the introduced Ar gas, the Ar gas subjected to the collision is ionized, and Ar ions (cations) are generated in the plasma generation chamber 10. A part of the cations generated in the plasma generation chamber 10 passes through the ion beam extraction hole of the second cathode 12, is accelerated by application of an acceleration voltage of about 5-10 kV between the second cathode 12 and the acceleration electrode 15 by an acceleration power supply, and is discharged to the outside of the ion gun from the ion beam extraction hole of the acceleration electrode. An ion beam is formed by an action of a beam forming electrode 20 on the way from the ion beam extraction hole of the second cathode 12 to the ion beam extraction hole of the acceleration electrode 15.

Figure 5B:
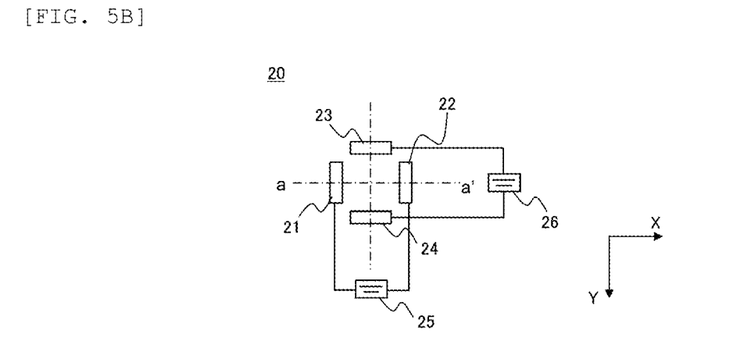
FIG. 5B is a diagram showing an arrangement and a structure of the beam forming electrode.

FIG. 5B is a diagram showing the arrangement of the beam forming electrode 20 taken along a line a-a' shown in FIG. 5A as seen from the plasma generation chamber 10 and a configuration of the peripheral portion thereof. The beam forming electrode 20 includes four electrodes 21, 22, 23, and 24. Two pairs of electrodes (21, 22) and (23, 24) facing each other are disposed so as to be orthogonal to each other along an X direction and a Y direction, respectively. A beam forming power supply 26 applies a positive voltage between the electrode 23 and the electrode 24 facing each other along the Y direction, and a beam forming power supply 25 applies a negative voltage between the electrode 21 and the electrode 22 facing each other along the X direction. Under such a voltage condition, a beam profile that expands in the X direction (longitudinal direction of the mask end) and contracts in the Y direction can be obtained. The width of the ion beam in the X direction can be expanded and contracted on the time axis by dynamically changing a ratio of absolute values of the voltages applied by the beam forming power supply 25 and the beam forming power supply 26.

Second Embodiment

Figure 6A:
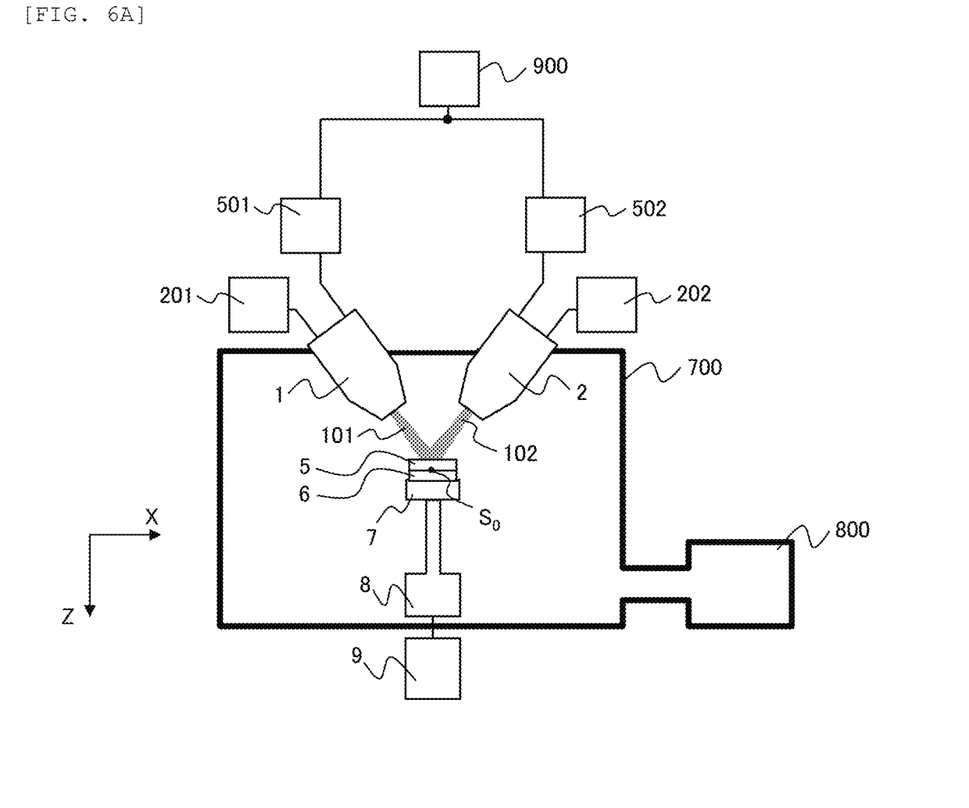
FIG. 6A is a cross-sectional schematic diagram of main parts showing a configuration of an ion milling device according to a second embodiment.
Figure 6B:
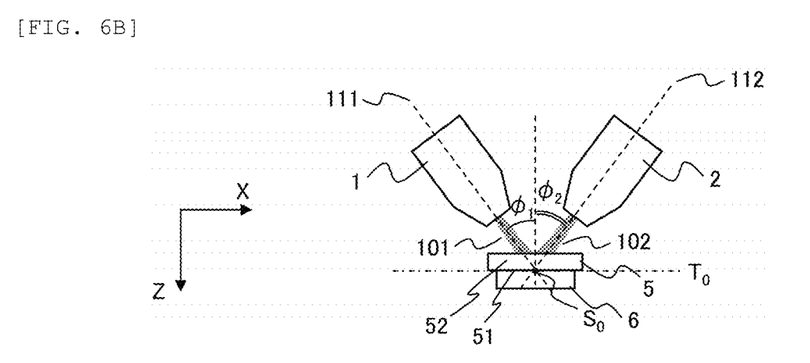
FIG. 6B is a cross-sectional schematic diagram illustrating an ion gun arrangement as seen from an X-Z plane.
Figure 6C:
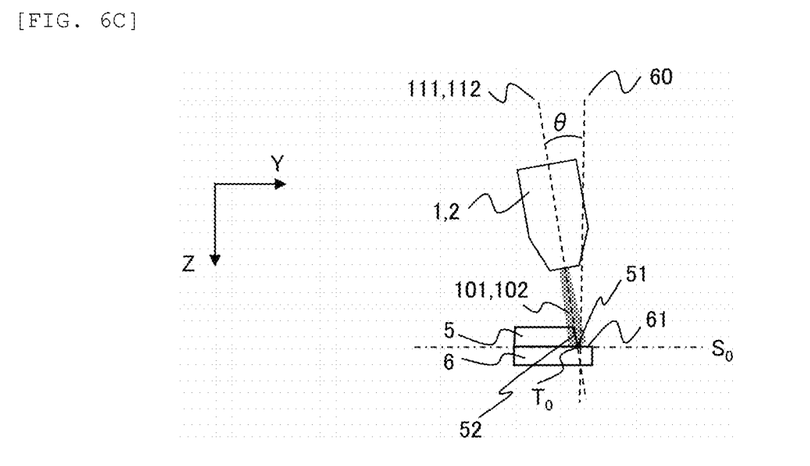
FIG. 6C is a cross-sectional schematic diagram illustrating the ion gun arrangement as seen from a Y-Z plane.

FIG. 6A is a cross-sectional schematic diagram of main parts showing a configuration of an ion milling device according to the second embodiment. FIG. 6B is a cross-sectional schematic diagram illustrating an ion gun arrangement with respect to the sample as seen from the X-Z plane, and FIG. 6C is a cross-sectional schematic diagram illustrating the ion gun arrangement with respect to the sample as seen from the Y-Z plane. Since the configuration corresponds to a configuration in which the ion gun 3 is removed from the ion milling device according to the first embodiment shown in FIG. 1A, a redundant description is omitted.

In addition, in the configuration according to the second embodiment, at least one of the ion gun 1 and the ion gun 2 is controlled such that the ion beam stream is not kept stationary. Specifically, as described in the first embodiment, an acceleration current is dynamically controlled (see FIGS. 4A and 4B), or the ion beam forming electrode is provided in the ion gun, and the major axis of the ion beam formed into the elliptical shape is expanded and contracted on the time axis (see FIGS. 5A and 5B). Therefore, the processing surface is further smoothed and flattened.

Figure 7:
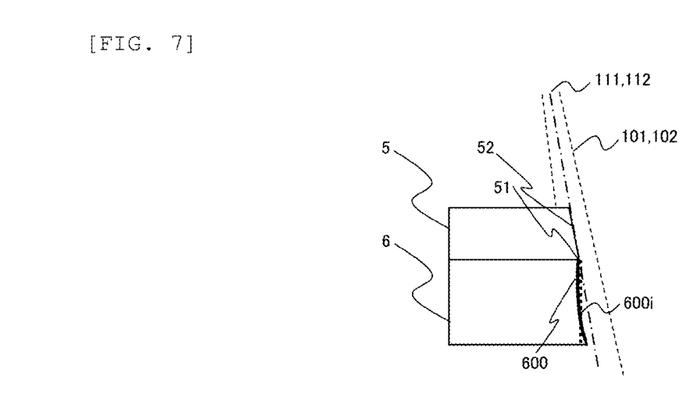
FIG. 7 is a cross-sectional schematic diagram illustrating an effect of the second embodiment.

FIG. 7 is a cross-sectional schematic diagram illustrating an effect of the second embodiment. In the cross-section processing performed by the ion milling device having device configurations of FIGS. 6A to 6C, as shown in FIG. 7, by inclining a plane (second plane) including the ion beam centers 111 and 112 of the two ion beams 101 and 102 incident on the sample 6 toward the mask at a predetermined angle with respect to a plane (first plane) defined by the normal 60 to the sample surface 61 of the sample 6 and the mask end 51, it is possible to form the processing surface 600 that is more perpendicular to the mask 5 than that in the related art while maintaining a high milling rate by the high acceleration ion beams 101 and 102. As compared with the processing surface (shown as a processing surface 600*i*) of the first embodiment, since the ion gun 3 is removed, there is a possibility that the distortion remains on the processing surface. When an observation surface has a small area, a cross section at a desired position can be obtained by a smaller-scale hardware. The number of ion beams disposed on the second plane is not limited to 2, and a larger number of ion beams may be disposed. In the second embodiment, when the sample stage driver 9 is disposed on the surface of the sample 6 and the sample stage 8 can be tilted about a tilt axis $T_0$ parallel to an X axis, the inclination angle θ can be made variable by tilting the sample stage 8.

REFERENCE SIGNS LIST

1, 2, 3 ion gun
5 mask
6 sample
7 sample platform
8 sample stage
9 sample stage driver
10 plasma generation chamber
11 first cathode
12 second cathode
13 anode
14 permanent magnet
15 acceleration electrode
16 insulator
17 cathode ring
18 ion gun base
19 gas introduction pipe
20 beam forming electrode
21, 22, 23, 24 electrode
25, 26 beam forming power supply
51 mask end
52 mask end surface
101, 102, 103, 105 ion beam
111, 112, 113, 115 ion beam center
135 acceleration voltage
201, 202, 203 ion gun control unit
501, 502, 503 gas supply mechanism
600 processing surface
610 processing profile
700 vacuum chamber
800 vacuum exhaust system
900 gas source

The invention claimed is:

1. An ion milling device, comprising:
a vacuum chamber in which an internal air pressure is controlled by a vacuum exhaust system;
a first ion gun to a third ion gun attached to the vacuum chamber and configured to emit unfocused ion beams; and
a sample platform disposed in the vacuum chamber and configured to hold a sample, wherein
a mask for shielding an ion beam is disposed on the sample,
the first ion gun to the third ion gun are attached to the vacuum chamber such that an ion beam center of the ion beam emitted by the third ion gun is included in a first plane defined by a normal to a surface of the sample and a mask end which is a boundary between the mask and the sample, and an ion beam center of the ion beam emitted by the first ion gun and an ion beam center of the ion beam emitted by the second ion gun are included in a second plane,
the second plane is inclined toward the mask with respect to the first plane, and an angle formed by the first plane and the second plane is more than 0 degree and 10 degrees or less, and
a processing surface of the sample is formed in a region where the ion beams emitted by the first ion gun to the third ion gun overlap on the surface of the sample.

2. The ion milling device according to claim 1, wherein the first ion gun is attached to the vacuum chamber such that an incident angle of the ion beam emitted by the first ion gun with respect to the surface of the sample is 10 degrees or more and 80 degrees or less, and the second ion gun is attached to the vacuum chamber such that an incident angle of the ion beam emitted by the second ion gun with respect to the surface of the sample is 10 degrees or more and 80 degrees or less.

3. The ion milling device according to claim 1, wherein a side surface of the mask including the mask end is inclined toward the mask with respect to the first plane.

4. The ion milling device according to claim 1, wherein each of the first ion gun to the third ion gun accelerates ions generated by colliding electrons with a gas supplied from the outside at a predetermined acceleration voltage and emits the ions as the ion beam,
each of the first ion gun to the third ion gun includes a control unit, and
the control unit of the third ion gun sets the acceleration voltage of the ion beam to be lower than the acceleration voltage of the ion beam set by the control unit of the first ion gun and the acceleration voltage of the ion beam set by the control unit of the second ion gun.

5. The ion milling device according to claim 3, wherein the control unit of at least one of the first ion gun to the third ion gun controls an ion beam stream emitted from the ion gun so as not to be kept stationary.

6. The ion milling device according to claim 5, wherein the control unit of at least one of the first ion gun to the third ion gun dynamically controls the acceleration voltage of the ion beam.

7. The ion milling device according to claim 3, wherein at least one of the first ion gun to the third ion gun includes an ion beam forming electrode for forming the ion beam, the control unit thereof forms the ion beam into an elliptical shape having a long axis along a longitudinal direction of the mask end by dynamically controlling a voltage to be applied to the ion beam forming electrode, and controls a major axis of the ellipse to expand and contract on a time axis.

8. The ion milling device according to claim 1, wherein the first ion gun to the third ion gun are Penning discharge type ion guns.

9. An ion milling device, comprising:
a vacuum chamber in which an internal air pressure is controlled by a vacuum exhaust system;
a first ion gun and a second ion gun attached to the vacuum chamber and configured to emit unfocused ion beams; and
a sample platform disposed in the vacuum chamber and configured to hold a sample, wherein
a mask for shielding an ion beam is disposed on the sample,
a processing surface of the sample is formed in a region where the ion beams emitted by the first ion gun and the second ion gun overlap on a surface of the sample,
an ion beam center of the ion beam emitted by the first ion gun and an ion beam center of the ion beam emitted by the second ion gun are included in a second plane, the second plane is inclined toward the mask with respect to a first plane defined by a normal to the surface of the sample and a mask end which is a boundary between the mask and the sample, and an angle formed by the first plane and the second plane is more than 0 degree and 10 degrees or less,
each of the first ion gun and the second ion gun includes a control unit, and
the control unit of at least one of the first ion gun and the second ion gun controls the ion beam stream emitted from the ion gun so as not to be kept stationary.

10. The ion milling device according to claim 9, wherein the first ion gun is attached to the vacuum chamber such that an incident angle of the ion beam emitted by the first ion gun with respect to the surface of the sample is 10 degrees or more and 80 degrees or less, and the second ion gun is attached to the vacuum chamber such that an incident angle of the ion beam emitted by the second ion gun with respect to the surface of the sample is 10 degrees or more and 80 degrees or less.

11. The ion milling device according to claim 9, wherein a side surface of the mask including the mask end is inclined toward the mask with respect to the first plane.

12. The ion milling device according to claim 9, wherein the control unit of at least one of the first ion gun and the second ion gun dynamically controls an acceleration voltage of the ion beam.

13. The ion milling device according to claim 9, wherein at least one of the first ion gun and the second ion gun includes an ion beam forming electrode for forming the ion beam, the control unit thereof forms the ion beam into an elliptical shape having a long axis along a longitudinal direction of the mask end by dynamically controlling a voltage to be applied to the ion beam forming electrode, and controls a major axis of the ellipse to expand and contract on a time axis.

14. The ion milling device according to claim 9, wherein the first ion gun and the second ion gun are Penning discharge type ion guns.

* * * * *